INVENTORS.
Stanley R. Meadows
Chalmer H. Lewis, Jr.
Carl E. Pearson
By: Mason, Kolehmainen, Rathburn & Wyss
Attys.

Feb. 25, 1958 S. R. MEADOWS ET AL 2,824,957
VERY HIGH FREQUENCY TELEVISION TUNER HAVING AN
ULTRA HIGH FREQUENCY ADAPTER
Filed Oct. 20, 1954 5 Sheets-Sheet 2

INVENTORS.
Stanley R. Meadows
Chalmer H. Lewis, Jr.
Carl E. Pearson
By: Mason, Kolehmainen, Rathburn + Wyss
Attys.

INVENTORS.
Stanley R. Meadows
Chalmer H. Lewis, Jr.
Carl E. Pearson
By: Mason, Kolehmainen, Rathburn & Wyss Attys.

INVENTORS.
Stanley R. Meadows
Chalmer H. Lewis, Jr.
Carl E. Pearson
By: Mason, Kolehmainen, Rathburn & Wyss
Attys.

INVENTORS.
Stanley R. Meadows
Chalmer H. Lewis, Jr.
Carl E. Pearson
By: Mason, Kolehmainen, Rathburn & Wyss
Attys.

United States Patent Office 2,824,957

Patented Feb. 25, 1958

2,824,957

VERY HIGH FREQUENCY TELEVISION TUNER HAVING AN ULTRA HIGH FREQUENCY ADAPTER

Stanley R. Meadows, Chalmer H. Lewis, Jr., and Carl E. Pearson, Bloomington, Ind., assignors to Sarkes Tarzian, Inc., Bloomington, Ind., a corporation of Indiana Application October 20, 1954, Serial No. 463,416

14 Claims. (Cl. 250—20)

The present invention relates to television tuners and has for an object the provision of a new and improved television tuner which is adapted selectively to receive signals from any one of the television channels in either of the existing television bands.

Under present standards, commercial television transmitting stations are assigned to both the V. H. F. band of from 54 to 88 megacycles and 174 megacycles to 216 megacycles and to the U. H. F. band of from 470 megacycles to 890 megacycles. With the allocation of the U. H. F. band to commercial television, many arrangements have been proposed to permit the reception of signals in both the V. H. F. and U. H. F. television band. One such arrangement is shown in the U. S. Patent No. 2,665,377, issued to J. E. Krepps, Jr., on January 5, 1954, and assigned to the same assignee as the present invention. However, most, if not all of these prior art arrangements require a considerably larger mounting space than the conventional V. H. F. tuner so that considerable difficulty is experienced in adapting the older television sets to receive U. H. F. television. Furthermore, with the ever increasing demand for smaller television cabinets and larger picture tubes, many television sets are designed so that the V. H. F. tuner is completely surrounded by other components of the receiver and it is virtually impossible to incorporate any of the combined V. H. F.-U. H. F. tuners now on the market in many existing television receivers because of the larger space which they require. When it is realized that many millions of television sets are now in use which only receive V. H. F. television stations, it will be readily apparent that there is a great need for a television tuner which will receive both V. H. F. and U. H. F. television stations while, at the same time, occupying only substantially the same space as the conventional V. H. F. tuner in existing receivers.

The U. H. F. television band comprises some seventy channels, any number of which may be assigned to a particular telecasting area. In some arrangements heretofore proposed provision has been made for the reception of a few U. H. F. channels by employing individual tuning strips for each U. H. F. station which may be plugged into the tuner to select the desired U. H. F. television stations. However, these arrangements suffer from the disadvantage that as new U. H. F. stations are allocated to a particular reception area, all of the television receivers in that area must be modified to receive each new U. H. F. station with the attendant cost in service and parts to each television set owner. Furthermore, in situations where the television set owner moves from one U. H. F. reception area to another area having U. H. F. stations on different channels, he has to replace his existing U. H. F. tuning strips with new ones which will permit him to receive the U. H. F. stations in his new location. It is, therefore, desirable to provide a combined V. H. F.-U. H. F. tuner which has complete coverage of all seventy channels of the U. H. F. band as well as complete coverage of the V. H. F. band while at the same time occupying only substantially the same space as a conventional V. H. F. tuner.

Since the U. H. F. band is made up of seventy channels, each six megacycles wide, and the U. H. F. tuner should be capable of selecting any television channel in the U. H. F. band, it will be evident that if all of the U. H. F. television channels are covered in one rotation of the U. H. F. tuning knob, extremely critical tuning will result since the U. H. F. stations will be very close together on the tuning dial. Accordingly, a vernier U. H. F. tuning arrangement is desirable so as to permit an accurate selection of the desired U. H. F. television station. However, it would be extremely desirable to provide such a U. H. F. vernier tuning arrangement while providing a tuner which is sufficiently compact that it can be used to replace the conventional V. H. F. tuner in older television sets.

Accordingly, it is a further object of the present invention to provide a new and improved television tuner which is adapted to receive all television stations in both the V. H. F. and U. H. F. television bands and which is of substantially the same dimensions as conventional V. H. F. tuners so that it may be incorporated in existing receivers to adapt them for U. H. F. reception without requiring any substantial modification of the receiver.

It is another object of the present invention to provide a new and improved television tuner which is adapted to provide complete coverage of both the V. H. F. and U. H. F. television bands while occupying substantially the same space as a conventional V. H. F. tuner and wherein a U. H. F. vernier tuning arrangement is provided so that accurate selection of the desired U. H. F. television station may be achieved.

It is a further object of the present invention to provide a new and improved combined V. H. F. and U. H. F. television tuner which is extremely compact and provides complete U. H. F. band coverage and wherein the U. H. F. portion of the tuner is adapted to be plugged into the V. H. F. portion of the tuner so that the U. H. F. tuner portion thereof can be added at any time.

It is a still further object of the present invention to provide a new and improved television tuner which is adapted to provide complete coverage of the U. H. F. television band and wherein a two-speed tuning arrangement is provided to permit accurate selection of a desired U. H. F. television station.

It is another object of the present invention to provide a combined V. H. F.-U. H. F. tuner wherein a common axis is provided for all controls of the tuner and wherein the V. H. F. vernier tuning control is completely independent of the U. H. F. station selector control.

It is still another object of the present invention to provide a combined V. H. F.-U. H. F. tuner wherein a common axis is provided for all controls of the tuner and wherein a U. H. F. station selector arrangement is provided which permits slow speed tuning over more than 360° of rotation of the U. H. F. station selector knob while providing high speed coverage of the complete U. H. F. television band in approximately two revolutions of the U. H. F. station selector knob.

The invention, both as to its organization and method of operation, together with further objects and advantages thereof, will best be understood by reference to the following specification taken in connection with the accompanying drawings, in which.

Figure 1:
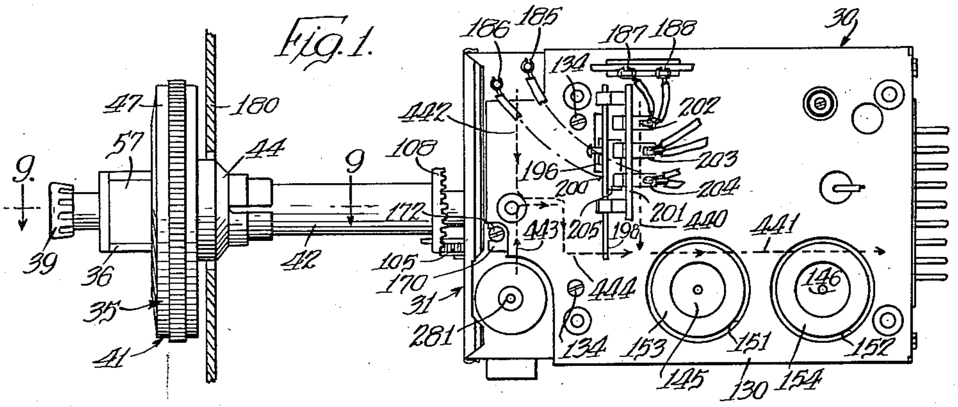
Fig. 1 is a plan view of a television tuner embodying the principles of the present invention.
Figure 2:
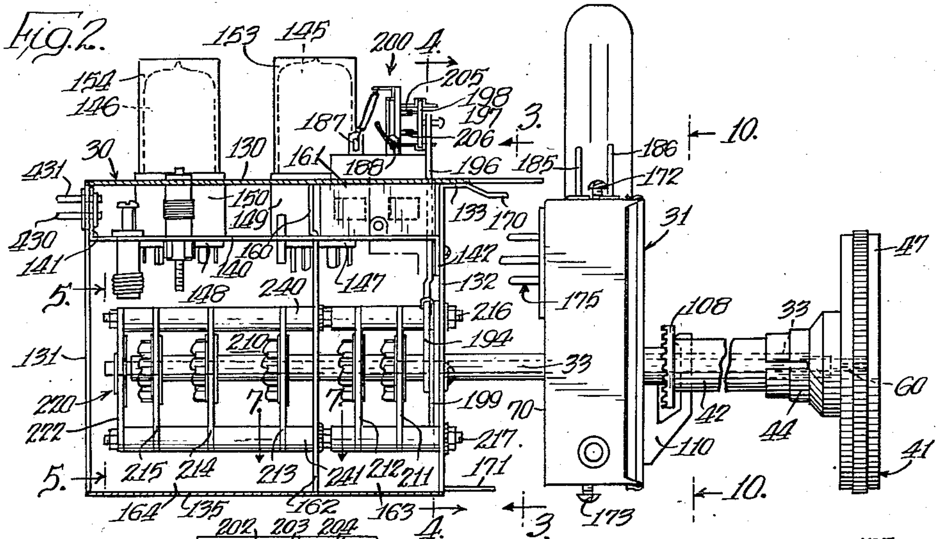
Fig. 2 is a side elevational view of the tuner of Fig. 1 and showing the U. H. F. portion thereof partially detached from the V. H. F. portion of the tuner.
Figure 3:
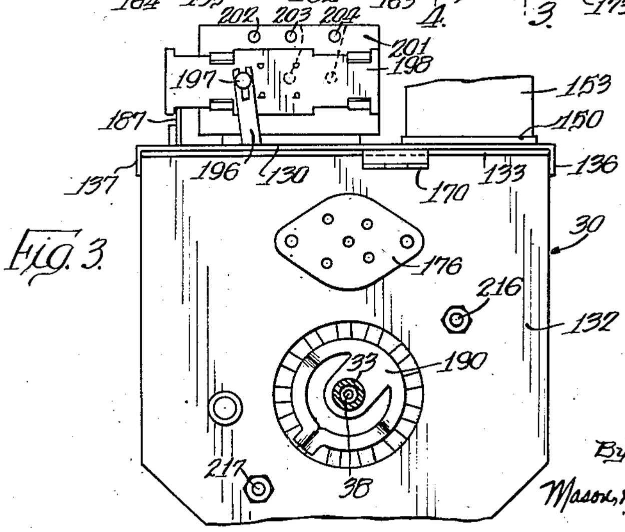
Figure 3:
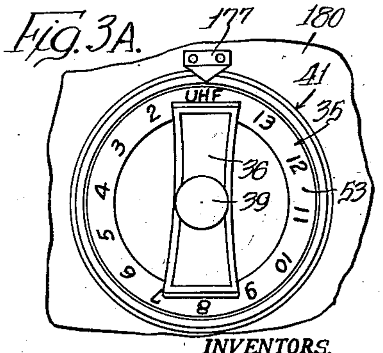
Figure 4:
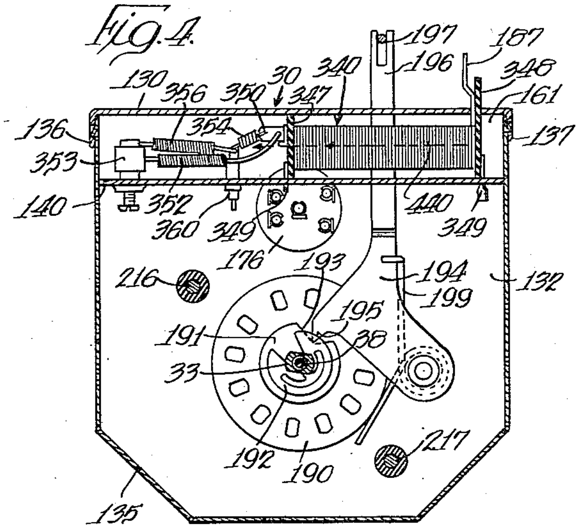
Figure 4A:
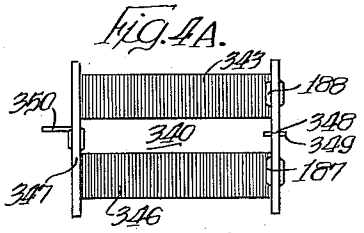
Figure 7:
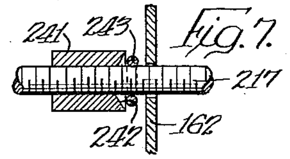
Figure 8:
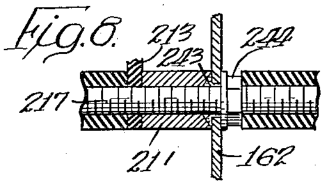
Figures 5, 6, 9:
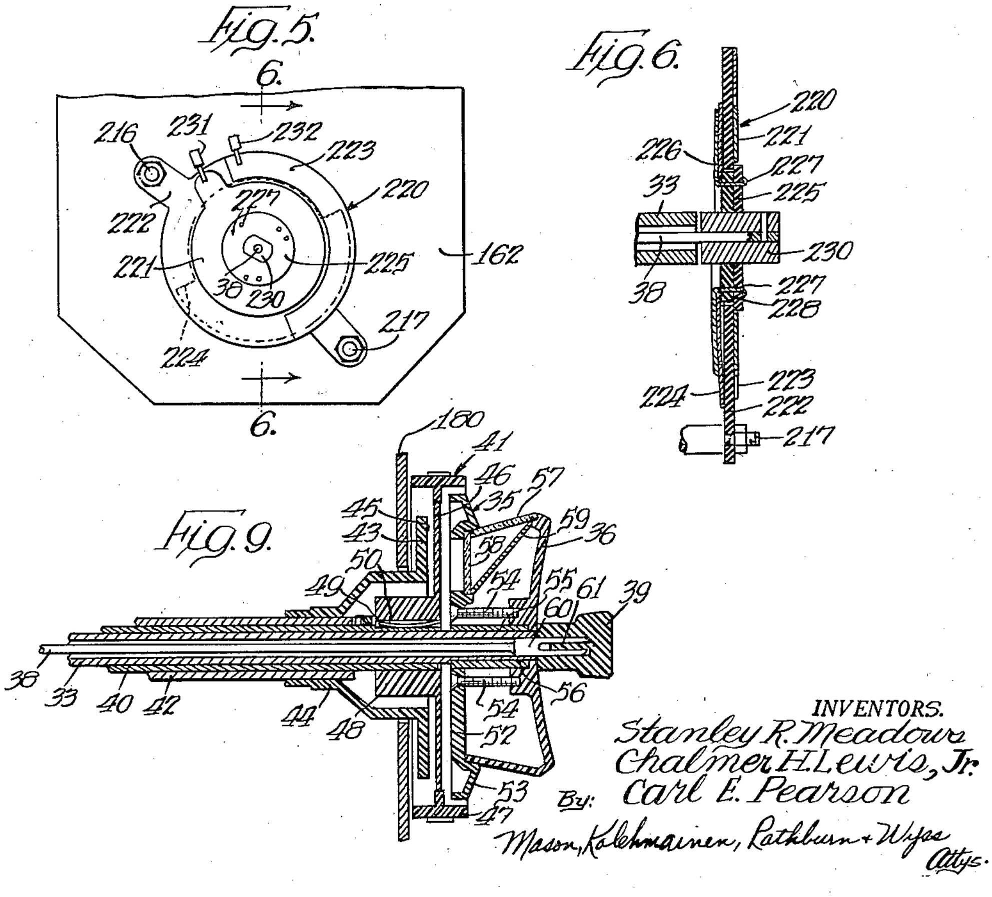
Figure 15:
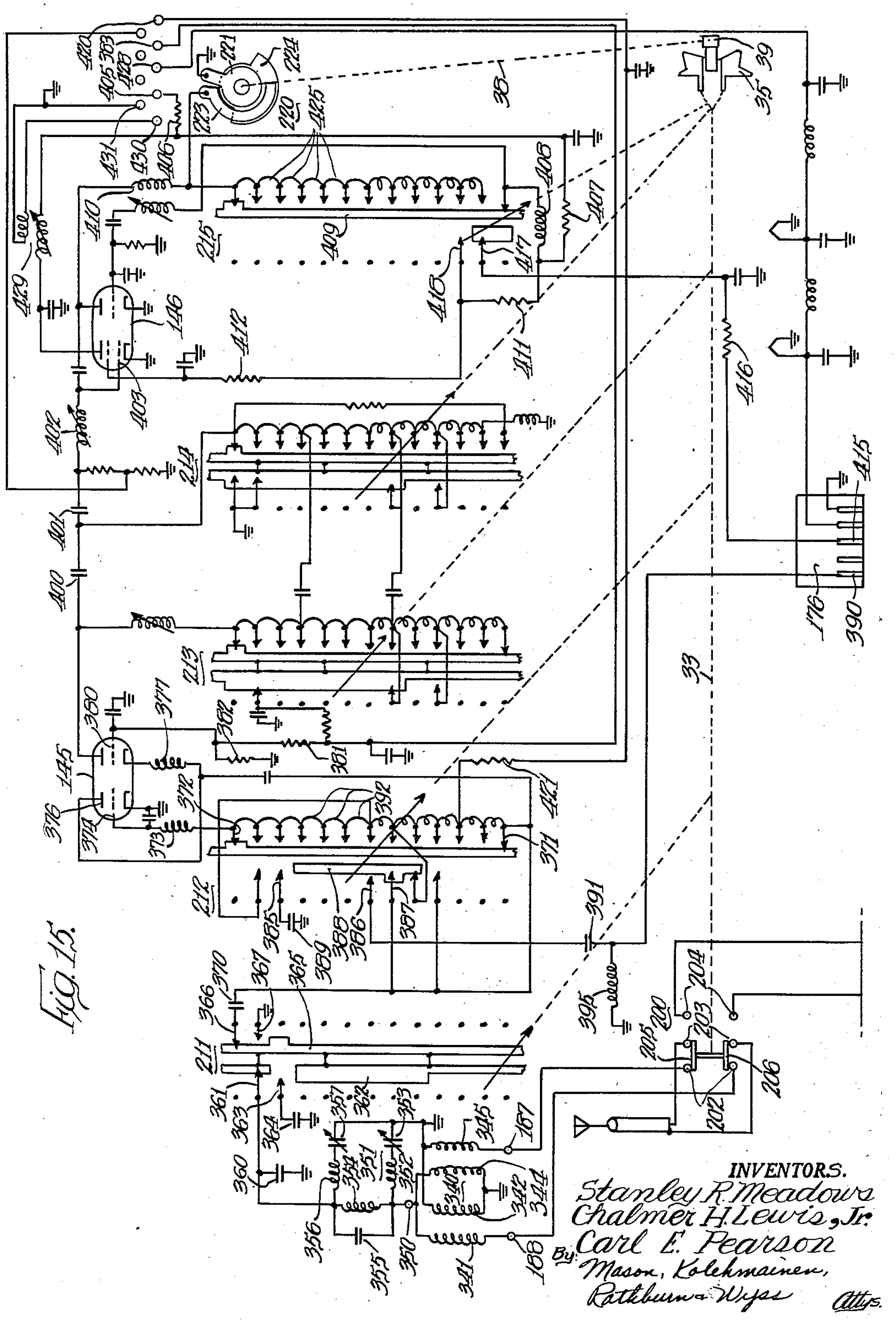
Figures 10, 11, 12, 13, 14, 14A:
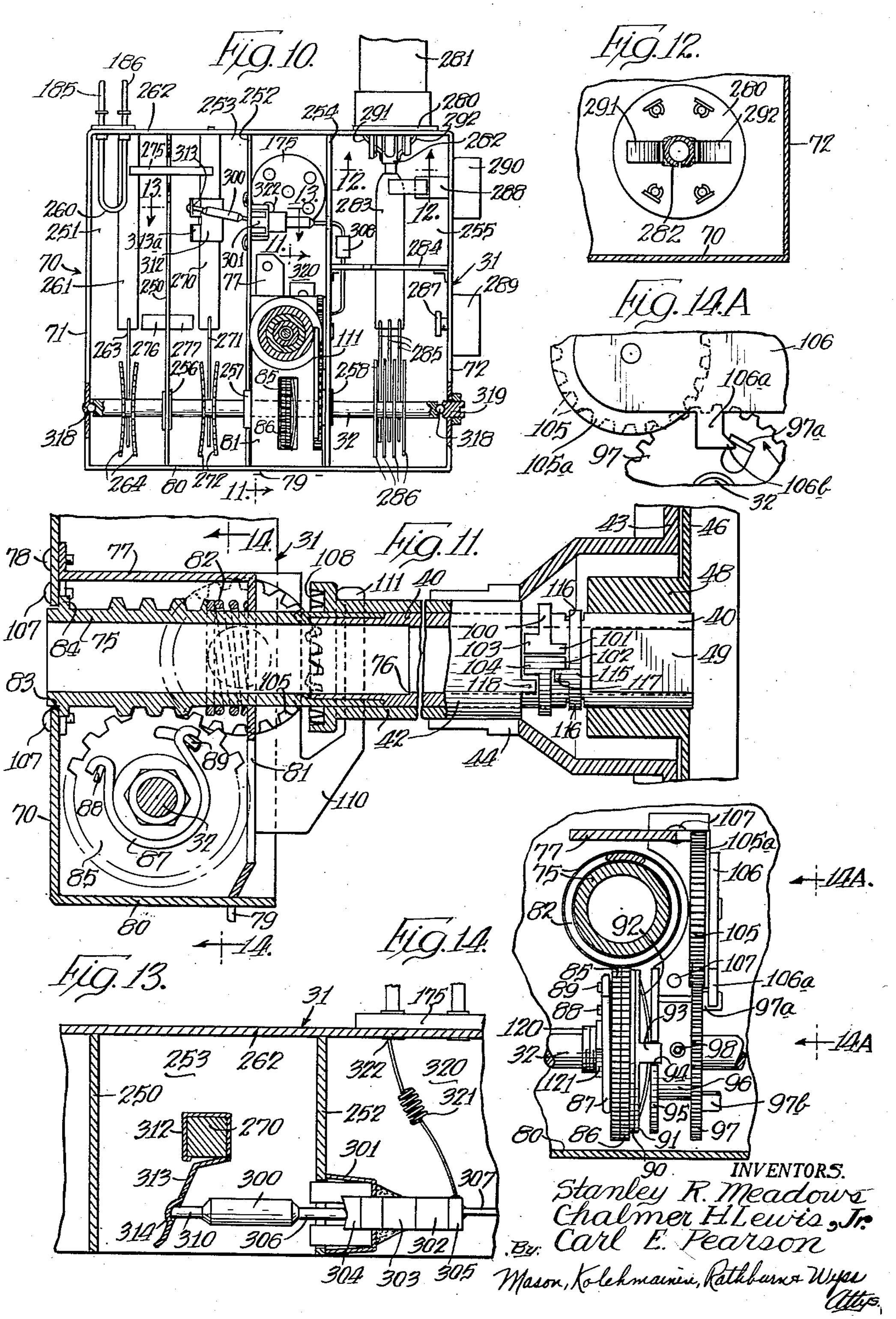
Figure 16:
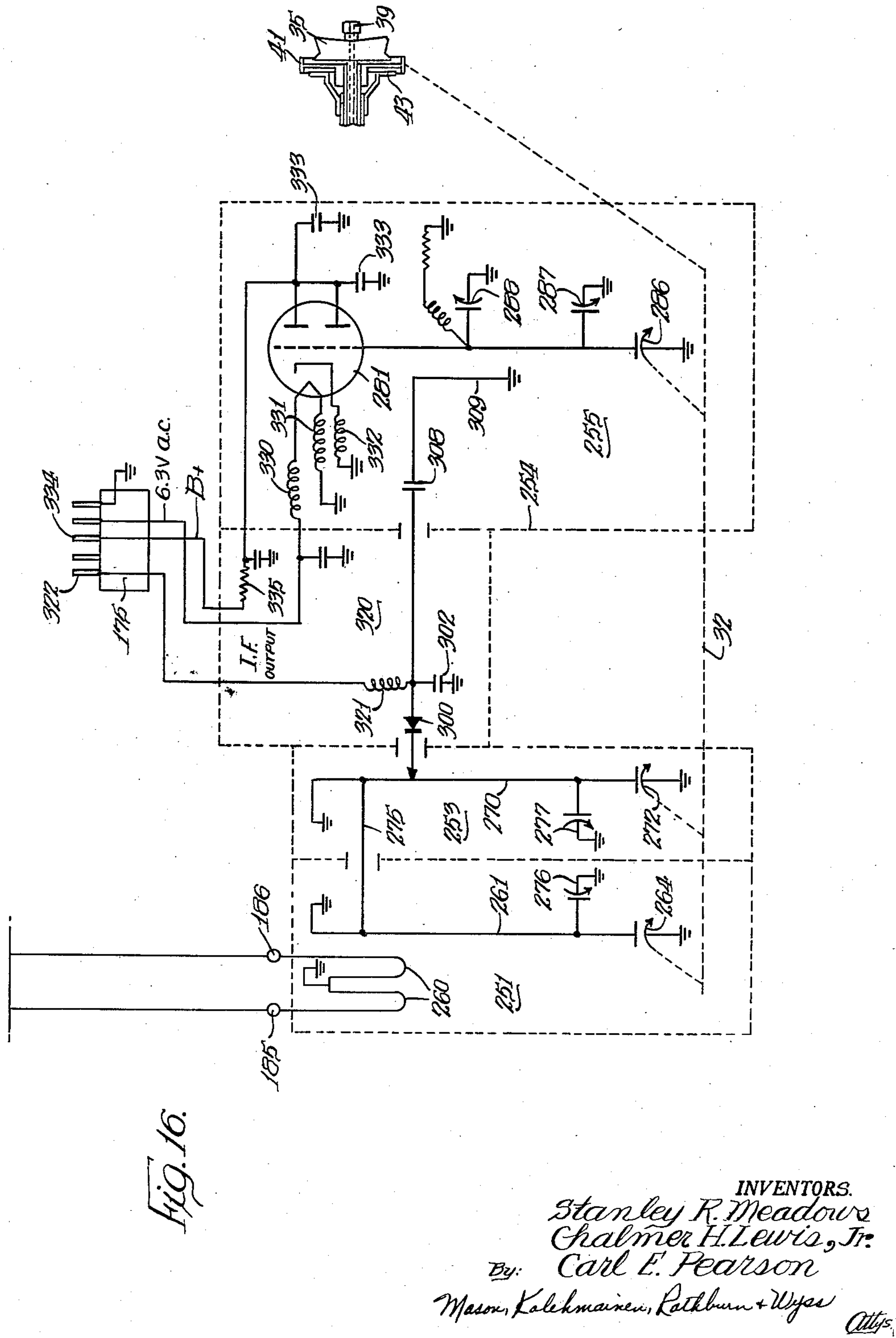

Fig. 3 is a sectional view taken along the line 3—3 of Fig. 2;

Fig. 3A is an elevational view of the control knobs of the tuner of Fig. 1 as viewed from the front panel of the receiver;

Fig. 4 is a sectional view taken along the lines 4—4 of Fig. 2;

Fig. 4A is a fragmentary plan view of the antenna tuning arrangement shown in Fig. 4;

Fig. 5 is a fragmentary sectional view taken along the lines 5—5 of Fig. 2;

Fig. 6 is a sectional view taken along the lines 6—6 of Fig. 5;

Figs. 7 and 8 are fragmentary sectional views taken along the lines 7—7 of Fig. 2 and showing one of the constructional features of the tuner of Fig. 1;

Fig. 9 is a sectional view taken along the line 9—9 of Fig. 1;

Fig. 10 is a side elevational view taken along the lines 10—10 of Fig. 2 and shown with the cover of the U. H. F. tuner portion removed;

Fig. 11 is a sectional view taken along the lines 11—11 of Fig. 10;

Fig. 12 is a sectional view taken along the lines 12—12 of Fig. 10;

Fig. 13 is a sectional view taken along the lines 13—13 of Fig. 10;

Fig. 14 is a sectional view taken along the lines 14—14 of Fig. 11;

Fig. 14A is a fragmentary elevational view taken along the lines 14A—14A of Fig. 14;

Fig. 15 is an electrical circuit diagram of the V. H. F. portion of the television tuner of Fig. 1; and Fig. 16 is an electrical circuit diagram of the U. H. F. portion of the television tuner of Fig. 1.

Referring now to the drawings, and more particularly to Figs. 1 to 14A, thereof, the combined V. H. F.-U. H. F. tuner of the present invention is therein illustrated as comprising a V. H. F. tuner portion indicated generally at 30 and a U. H. F. tuner portion indicated generally at 31. In order to provide a compact tuner unit which may be substituted for existing V. H. F. tuners while providing a common axis for both the V. H. F. and U. H. F. tuner controls, the U. H. F. tuner 31 is positioned transversely across the front end of the V. H. F. tuner portion 30 so that the main tuning shaft 32 (Fig. 10) of the U. H. F. tuner portion 31 is disposed in a plane which is at right angles to the main tuning shaft 33 of the V. H. F. tuner portion 30. Hereinafter these shafts are referred to as being perpendicular or at right angles to one another but it will be understood that by this is meant that one of the shafts lies in a plane which is perpendicular to the other shaft.

The V. H. F. tuner portion 30 is of the type generally referred to as a switch type tuner wherein the main tuning shaft 33 has a plurality of discreet positions including twelve V. H. F. station selecting positions and a U. H. F. tuner selecting position. More particularly, a V. H. F. station selector knob, indicated generally at 35, is secured to the end of the tuning shaft 33 and is provided with a transversely extending bar portion 36 which may be gripped by the operator to rotate the shaft 33 to any desired position. The shaft 33 is hollow and a V. H. F. vernier tuning shaft 38 is positioned within the tuning shaft 33 concentrically therewith. A V. H. F. vernier tuning knob 39 is secured to the end of the vernier tuning shaft 38 and extends through the center of the bar portion 36 of the V. H. F. station selector knob 35.

In order to provide a combined V. H. F.-U. H. F. tuner arrangement wherein a common axis for both the V. H. F. and U. H. F. tuning controls is provided, the U. H. F. main tuning shaft 32 is interconnected, by means of a gearing arrangement to be described in more detail hereinafter, to a hollow tuning shaft 40 which is positioned concentrically with the tuning shaft 33 in telescoping relation thereto. A U. H. F. tuning knob indicated generally at 41 is secured to the end of the tuning shaft 40 so that rotation of the knob 41 produces rotation of the U. H. F. main tuning shaft 32. A hollow U. H. F. indicator sleeve 42 is positioned concentrically with the tuning shaft 40 in telescoping relation thereto and the sleeve 42 is connected, by means of a gearing arrangement to be described in more detail, to the U. H. F. main tuning shaft 32 so as to rotate therewith. The sleeve 42 carries at the outer end thereof a U. H. F. indicator dial 43 which is provided with a hub portion 44 which is secured to the outer end of the sleeve 42.

In order to permit viewing of the U. H. F. television channel numbers, which are printed or otherwise suitably inscribed on the outer surface 45 of the U. H. F. indicator dial 43, the U. H. F. station selector knob 41 is provided with a transparent disc portion 46 connecting the outer rim 47 of the knob 41 to a central hub portion 48, the hub 48 being held in engagement with a flatted portion 49 on the shaft 40 by means of the retaining spring 50. The V. H. F. station selector knob 35 comprises a plastic disc portion 52 which is provided with a sloping annular surface 53, on which the V. H. F. channel selecting positions of the V. H. F. tuner portion 30 may be suitably inscribed, the bar portion 36 being secured to the disc 52 by means of the screws 54. A metal insert 55 is positioned between the disc 52 and the bar portion 36 and is adapted to engage a flatted surface 56 on the V. H. F. tuning shaft 33 so that the knob 35 is secured thereto. The knob 35 is provided with a transparent window portion 57 in one end of the bar 36 and a transparent window section 58 is provided in the disc 52, a forty-five degree mirror 59 being provided so that the U. H. F. channel numbers on the dial 43 may be viewed through the transparent sections 46, 58 and 57. The V. H. F. vernier tuning shaft 38, which is of substantially smaller diameter than the inside diameter of the shaft 33, for reasons to be described in more detail hereinafter, is provided with a bifurcated end portion 60 which is journaled in the end of the tuning shaft 33, the vernier tuning knob 39 being provided with a transverse web portion 61 which engages the bifurcated portion 60 to lock the knob 39 to the tuning shaft 38.

Considering now the manner in which the U. H. F. station selector knob 41 is connected to drive the U. H. F. tuning shaft 32, it will be understood that the U. H. F. tuner portion 31 comprises a cup-shaped housing 70 and the tuning shaft 32 is journaled in the end walls 71 and 72 of the housing 70. As will be described in more detail hereinafter, one-half rotation of the tuning shaft 32 is sufficient to tune the U. H. F. tuner portion 31 to any television station in the U. H. F band, and it will be evident that if the knob 41 is directly connected to the shaft 32 an extremely critical U. H. F. tuning operation would be required to select a particular U. H. F. television station. In order to drive the shaft 32 from the knob 41 at a reduced rate while providing a gearing arrangement which is extremely compact and suitable to interconnect the perpendicularly related shafts 32 and 40, there is provided a worm element 75 which is press fitted on the end of the hollow tuning shaft 40. The worm element 75 is provided with a sufficiently large central bore that clearance between the worm 75 and the V. H. F. main tuning shaft 33 is obtained to prevent binding between these members as they are individually rotated. Also the tuning shaft 40 is provided with a counter bore 76 to prevent binding between the shafts 33 and 40 adjacent the bearing for the shaft 33 in the V. H. F. tuner portion 30. A supporting bracket 77 is secured at one end to the housing 70 by means of the screw 78 and is provided at the other end thereof with a pair of lug portions 79 which extend through suitable openings in the bottom wall 80 of the housing 70. The worm element 75 is mounted in a suitable opening in the vertical wall 81 of the bracket 77 and is provided with an annular rim portion 84 which is held against the rear wall 70 of the housing by means of a helical spring 82 which is positioned between the worm and the bracket wall 81, the end of the worm element 75 extending through the opening 83 in the rear wall 70. The worm element 75 is arranged to engage the split gears 85 and 86, the gear 86 being rotatably mounted on a hub 96 which is secured to the shaft 32 by means of the set screw 98. The gear 85 is rotatably mounted on a hub portion of the gear 86 and a spring 87 is connected to the lug portions 88 and 89 on the gears 85 and 86, respectively, so as to urge these gears apart and provide an anti-backlash driving arrangement. A friction disc 90 is positioned between the gear 86 and a thin metal clutch plate 91 which is also rotatably mounted on the hub 96, the plate 91 being urged into engagement with the friction disc 90 by means of the spring element 92 so that the plate 91 normally rotates with the gears 85 and 86. The plate 91 is provided with a laterally extending tongue 93 which is positioned within a notch 94 in the periphery of a disc 95 which is secured to the hub portion 96 and a spur gear 97 is also secured to the end of the hub 96. As the shaft 40 is rotated by manipulation of the knob 41, the worm element 75 functions to drive the gears 85, 86 at a speed reduction ratio of approximately 40 to 1 so that the U. H. F. tuner portion 31 may be accurately tuned to the desired U. H. F. station.

In order to drive the U. H. F. tuning sleeve 42 in substantially direct ratio from the U. H. F. tuning shaft 32 so that the U. H. F. station position of the shaft 32 may be determined by viewing the dial 43, a spur gear 105 is rotatably mounted on a bracket 106 which is secured to the housing 70 by means of the screws 107, the gear 105 engaging the spur gear 97 which is secured to the shaft 32. A crown gear 108, which is secured to the end of the indicator sleeve 42, is arranged to engage the spur gear 105, the bracket 77 being provided with a flange portion 110 having an arm portion 111 which is adapted to engage the back of the crown gear 108 so as to maintain the gear 108 in engagement with the gear 105. The gears 97, 105 and 108 are so chosen that the tuning sleeve 42, and hence the U. H. F. indicator dial 43, is driven in substantially direct ratio to the U. H. F. tuning shaft 32. In this connection, it will be noted that the worm element 75, crown gear 108 and the shafts connected thereto may be removed as a unit by simply removing the screw 78 which holds the bracket 77 in place so that servicing of the gearing is greatly simplified.

In order to provide a U. H. F. tuning arrangement wherein both slow speed and high speed tuning are available so that the U. H. F. band may be covered rapidly while permitting accurate tuning to a particular U. H. F. station, there is provided means for bypassing the above described worm drive arrangement and driving the tuning shaft 32 in substantially direct ratio from the U. H. F. station selector knob 41. More particularly, there is provided a lost motion connection between the shaft 40 and the tuning sleeve 42 so that the U. H. F. tuning shaft 32 is directly driven through the gears 108, 105 and 97 at either end of the U. H. F. slow speed tuning range in which the worm element 75 drives the shaft 32 at a reduced speed. Thus, the arms of a C-washer 115 are positioned within the notches 116 in the shaft 40 and the C-washer 115 is provided with a lug 117 extending rearwardly along the shaft 40. A split ring 100 is rotatably mounted on the shaft 40 and is provided with end portions 101 and 102 which may be engaged by the lug 117. The ring 100 is also provided with rearwardly extending end portions 103 and 104 which are adapted to engage a lug 118 formed in the end of the tuning sleeve 42. As the U. H. F. tuning knob 41 is rotated, the shaft 40 drives the tuning shaft 32 through the worm element 75 and the above described gearing while the lug 117 engages one of the end portions 101, 102 and thereafter rotates the ring 100. However, when one of the end portions 103, 104 engages the lug 118 the shaft 40 is directly connected to the sleeve 42 so as to rotate the sleeve 42 in substantially direct ratio to rotation of the knob 41 upon continued rotation of the knob 41 in the same direction. Accordingly, a high speed U. H. F. tuning operation may then be effected so that the shaft 32 is directly driven through the crown gear 108 and the gears 105 and 97 and the U. H. F. band may be completely covered in less than one revolution of the tuning knob 41. When the shaft 32 is directly driven in the manner described above from the sleeve 42, the clutch plate 91 slides over the surface of the friction disc 90 so that the gears 85, 86 are effectively disengaged from the shaft 32. In order to adjust the force with which the clutch plate 91 is urged into engagement with the disc 90, the hub 96 is provided with a threaded portion 120 and an adjustment nut 121 on the threaded portion 120 is employed to force the gear 86 and the friction disc 90 into engagement with the clutch plate 91 so as to provide the desired frictional contact between these members. In this connection it will be understood that the frictional contact between the members 86, 90 and 91 must be sufficient to drive the shaft 32 from the worm element 75 while permitting slippage between these members when the shaft 32 is directly driven from the tuning sleeve 42 in the manner described above.

In order to limit rotation of the shaft 32 to the effective tuning range of the U. H. F. tuning components, the gear 97 is provided with outwardly extending lug portions 97*a* and 97*b* which are adapted to engage a projecting arm 106*a* on the bracket 106 so as to limit the rotation of the shaft 32 to approximately 180°. The arm 106*a* is provided with a hook portion 106*b* which engages the edge of the lug 97*a* in the extreme position of the shaft 32 shown in Fig. 14A. With this arrangement, if excessive force is exerted on the gears 105 and 97 when the operator comes to the end of the U. H. F. band, the gears 105 and 97 do not become unmeshed since the engagement of the lug 97*a* with the hook portion 106*b* prevents movement of the bracket 106 away from the gear 97. When the lug 97*b* engages the other side of the arm 106*a* at the other end of the U. H. F. band, the force on the gear 105 is in a direction tending to hold the gears 105 and 97 together so that a corresponding hook portion is not required. It will also be noted that the teeth of the gear 105 are blocked on one side by an edge portion 105*a* which extends radially outwardly to the tips of the gear teeth. The edge portion 105*a* serves as a reference point so that the hub 96 may be assembled on the shaft 32 by merely bringing the gears 97 and 105 into mesh. Also the edge portion 105*a* prevents the crown gear 108 from pulling the gear 105 sidewise so that the gears 105 and 108 stay in mesh.

With the above described U. H. F. tuning arrangement, the worm 75 may be employed to drive the shaft 32 at a relatively slow speed for vernier U. H. F. tuning while, at the same time, permitting the shaft 32 to be directly driven from the sleeve 42 to provide for rapid scanning of the U. H. F. band. In this connection it will be understood that if a U. H. F. station at one end of the U. H. F. band is to be selected, the knob 41 is rotated until the lug 117 engages the end portion 102 and the end portion 103 engages the lug 118 and the shaft 32 is then directly driven to a point just slightly beyond the desired television station as indicated on the dial 43. Rotation of the knob 41 is then reversed so that the vernier tuning action described above is provided and the desired U. H. F. station may be accurately selected. It will be noted that the vernier U. H. F. tuning action is provided over almost two full revolutions of the knob 41, i. e., until the lug 117 moves into engagement with the end portion 101 and the end portion 104 engages the lug 118, so that slow speed vernier tuning is provided over a sufficient range to ensure selection of the desired U. H. F. station within the slow speed range of the knob 41. In this connection, it will be understood that the vernier tuning range may be increased beyond two revolutions of the knob 41 by providing one or more additional lost motion links similar to the ring 100 so that the direct connection between the shaft 40 and the sleeve 42 is obtained only after a correspondingly greater rotation of the knob 41 in either direction. It will also be understood that the ring 100 may be omitted in the event that less than one revolution of slow speed tuning is sufficient, in which case the lug 117 would engage the lug 118 directly to establish the above described direct connection between the shaft 40 and the shaft 32.

Considering now the mechanical and electrical features of the V. H. F. tuner portion 30 in more detail, the top plate 130 and the back plate 131 of the tuner portion 30 are formed integrally of sheet metal and a front panel 132 is provided with a flange portion 133 which is secured to the the top plate 130 by means of the screws 134, a sheet metal cover plate 135 being provided which extends over the edges of the front and back panels 132 and 131 and hooks under the side flanges 136 and 137 of the top plate 130 so as to provide a completely shielded unit. In order to provide an extremely compact V. H. F. tuner portion while at the same time providing an arrangement wherein oscillator radiation is substantially prevented, a sub-chassis plate 140 is provided having an upstanding flange 141 which is secured to the back panel 131 and a down-turned flange 142 which is secured to the front panel 132. The V. H. F. tuner portion 30 is provided with a first dual purpose signal amplifying tube 145, which operates as a radio frequency amplifier for V. H. F. television reception and as an I. F. amplifier for U. H. F. reception, and a second dual purpose signal translating tube 146 which operates as a combined mixer and local oscillator for V. H. F. reception and as an I. F. amplifier for U. H. F. reception, as will be described in more detail in connection with the electrical circuit diagram shown in Fig. 15. The tubes 145 and 146 are mounted in the tube sockets 147 and 148 and are shielded by the bottom tubular shielding members 149 and 150 which extend through clearance holes 151 and 152 in the top plate 130 and receive the upper shielding members 153 and 154. With this arrangement the chassis currents developed by the tuner circuits flow in the sub-chassis member 140 and the tube shielding elements are spaced from the top plate 130 so that a double shielding arrangement is provided by the members 140 and 130 with the result that radiation from the local oscillator during V. H. F. reception is substantially reduced. In this connection it will be noted that the top and back plates 130 and 131 may be removed as a unit so as to facilitate servicing of the V. H. F. tuner portion 30.

The sub-chassis 140 supports a shielding partition 160 which extends between the members 140 and 130 and defines, together with the socket shielding member 149, an antenna tuning compartment 161 (Fig. 4) within which the V. H. F. antenna input components are positioned so that they are shielded from the other components of the V. H. F. tuner portion 30, as will be described in more detail in connection with the electrical circuit diagram shown in Fig. 15. The sub-chassis 140 also supports a shielding partition 162 which defines an R. F. tuning compartment 163 within which the R. F. components of the V. H. F. tuner portion 30 are positioned and a mixer and local oscillator tuning compartment 164 within which the other components of the tuner portion 30 are located.

In order to provide a combined V. H. F.–U. H. F. tuner wherein the U. H. F. portion may be readily removed for servicing and testing apart from the V. H. F. portion thereof, while at the same time providing an arrangement wherein the V. H. F. and U. H. F. portions are cooperatively positioned for minimum signal interference therebetween and optimum tube orientation, a plug-in arrangement is provided for the U. H. F. tuner portion 31. More particularly, the flange portion 133 of the front wall 132 is provided with an outwardly extending arm 170 and a bottom flange 171 is provided so that the housing 70 of the U. H. F. tuner portion 31 may be securely held in the position shown in Fig. 1 by means of the screws 172 and 173. A multi-prong electrical plug 175 is mounted on the rear wall of the housing 70 and is adapted to engage a corresponding electrical receptacle 176 which is positioned on the front wall 132 of the V. H. F. tuner portion 30, it being understood that the necessary electrical connections between the tuner portions 30 and 31 are established through the plug 175 and receptacle 176, as will be described in more detail hereinafter in connection with the electrical circuit diagram of Fig. 15. Accordingly, when it is desired to remove the U. H. F. portion 31 it is only necessary to loosen the screws 172 and 173 and remove the V. H. F. vernier tuning knob 39 and the V. H. F. station selector knob 35 so that the U. H. F. tuner portion 31 can be slid off the end of the V. H. F. tuning shaft 33 in the manner shown in Fig. 2. It will be noted that the above described plug-in arrangement of the U. H. F. tuner portion 31 has the further advantage that the V. H. F. tuner portion 30 may be installed in a television receiver and the U. H. F. portion 31 added at a later date in the event that U. H. F. television stations are subsequently licensed to telecast in that receiving area. Furthermore, no changes in the receiver are required to adapt the receiver for U. H. F. reception. This will be readily apparent from Fig. 9 when it is realized that if the U. H. F. station selector knob 41 and the U. H. F. indicator dial 43 are not employed, i. e., in situations where the U. H. F. tuner portion 31 is not required, the V. H. F. station indicating surface 53 of the V. H. F. station selector knob is positioned relatively close to the front panel 180 of the receiver to permit ready selection of the desired V. H. F. television station by manipulating the bar portion 36 of the knob 35 until the desired V. H. F. channel number is aligned with an index pointer 177 (Fig. 3A) on the front panel 180. Furthermore, when the U. H. F. tuner portion 31 is added, the V. H. F. station selector knob 35 nests within the outer cup-shaped portion of the U. H. F. station selector knob 41 so as to permit the above described V. H. F. station position alignment while providing at the same time a two-speed U. H. F. station selecting control and corresponding U. H. F. station indicator. However, it will be understood that the U. H. F. tuner portion 31 may be formed integrally with the V. H. F. tuner portion 30 in the event that the above described plug-in arrangement is not required, in which case the front panel 132 of the V. H. F. tuner portion would be provided with side walls so as to provide a U. H. F. housing similar to the housing 70, as will be readily understood by those skilled in the art.

In order to permit a combined V. H. F.–U. H. F. antenna system to be employed with the tuner of the present invention, an antenna switching arrangement is provided so that when the bar portion 36 of the V. H. F. station selector knob 35 is in the correct vertical position for viewing the U. H. F. indicator dial 43 through the mirror 59, i. e., the U. H. F. tuner selecting position shown in Figs. 3A and 9, the antenna is connected to the antenna input terminals 185 and 186 of the U. H. F. tuner portion 31 and when the V. H. F. station selector switch 35 is in any one of the V. H. F. station selecting positions, i. e., channels 2 to 13 (Fig. 3A) the antenna is connected to the antenna input terminals 187 and 188 of the V. H. F.

tuner portion 30. More particularly, the V. H. F. main tuning shaft 33 is journaled in an indexing plate 190 which is secured to the front panel 132 and a hub 191 is secured to the shaft 33 by means of the C washer 192 so that the hub 191 rotates with the shaft 33. The hub 191 is provided with a notch 193 in the periphery thereof and an actuating lever 194, which is pivotally mounted on the panel 132, is provided with a finger portion 195 which rides on the periphery of the hub 191 and is biased into engagement therewith by means of the spring 199. The lever 194 is provided with an upwardly extending arm portion 196 having a bifurcated end portion which engages a pin 197 secured to a movable contact carrying member 198 of insulating material which forms a part of the antenna switching assembly indicated generally at 200 which is positioned on the top plate 130. The assembly 200 includes a mounting plate 201 of insulating material which is secured to the top plate 130 and carries three pairs of contacts 202, 203 and 204. The V. H. F. antenna input terminals 187 and 188 are connected to the switch contacts 202, the common antenna input conductors are connected to the switch contacts 203 and the U. H. F. antenna input terminals 185 and 186 are connected to the switch contacts 204. The movable member 198 carries a pair of switch blades 205 and 206 which may be shifted laterally upon movement of the member 198 to connect the contacts 203 either to the contacts 202 or the contacts 204. Accordingly, when the station selector knob 35 is in any one of the V. H. F. station selecting positions, the finger portion 195 of the lever 194 rides on the periphery of the hub 191 so that the movable member 198 is positioned to connect the contacts 202 and 203 together and the common antenna system is connected to the V. H. F. antenna input terminals 187 and 188. However, when the knob 35 is shifted to the vertical position shown in Fig. 9 wherein U. H. F. reception is provided, the notch 193 is engaged by the lever 194 so that the member 198 is shifted to connect the contacts 203 to the contacts 204 and the antenna system is shifted to the U. H. F. antenna input terminals 185 and 186. In this connection, it will be understood that the above described antenna switching arrangement may not be required if separate V. H. F. and U. H. F. antenna systems are employed in which case the V. H. F. antenna is permanently connected to the terminals 187 and 188 and the U. H. F. antenna is connected to the terminals 185 and 186. It will also be noted that the above described antenna switching arrangement is independent of any switching within the V. H. F. tuner portion 30 since the arrangement 200 is mechanically actuated from the shaft 33. Accordingly, the antenna switching arrangement 200 may be readily added for receivers which employ a common antenna system or removed for receivers which employ separate antenna systems without affecting the internal switching of the V. H. F. tuner portion 30.

The V. H. F. station selector switch, which is indicated generally at 210, comprises a plurality of switch sections 211, 212, 213, 214 and 215 which are supported between stand-off insulators from the front panel 132 by means of the screws 216 and 217, the switch sections 211 and 212 being positioned within the tuning compartment 163 whereas the switch sections 213, 214 and 215 are positioned within the tuning compartment 164. As will be described in more detail in connection with the electrical circuit diagram of Fig. 15, the switch sections 211 to 215, inclusive, each includes an annular rotor plate or plates and a plurality of angularly spaced stator switch contacts for selectively providing tuned circuits suitable to select any desired station in the V. H. F. band and to convert the received signal to a corresponding intermediate frequency. In addition, the station selector switch 210 carries at the rear end thereof, a V. H. F. vernier tuning condenser which is of the split stator type and may be controlled independently of movement of the shaft 33 by means of the vernier tuning shaft 38. More particularly, the vernier tuning condenser 220 includes a thin annular copper strip 221 which is positioned on one side of a plate 222 of insulating material which is supported by the screws 216 and 217. A semi-circular strip of copper 223 is positioned on the member 222 adjacent the annular strip 221 so that the strips 221 and 223 form the stator plates of the variable condenser. On the other side of the plate 222 there is provided a semi-circular plate 224 which is secured to a hub 225 of insulating material by means of an overlapping conductive plate 226 provided with locking prongs 227 which extend through the hub 225, the hub 225 being loosely mounted within a mounting hole 228 in the plate 222. The hub 225 is provided with a double D opening adapted to receive a correspondingly shaped shaft section 30 which is secured to the end of the vernier tuning shaft 238. Accordingly, rotation of the vernier tuning knob 229 causes rotation of the rotor plate 224 so as to produce a variable overlapping of the plates 221 and 223 by the rotor plate 224 with the result that a variable capacity is produced between the output terminals 231 and 232 of the vernier tuning condenser 220.

It will be noted that the vernier tuning shaft 38 is of substantially smaller diameter than the inside diameter of the tuning shaft 33 so that substantial lateral movement of the shaft 38 can be tolerated without producing binding between the shafts 33 and 38. With this arrangement the insulating member 222 can be employed as a bearing member for the rotatable hub 225 so that an extremely simple and inexpensive vernier tuning condenser is provided. Furthermore, it will be noted that the vernier tuning condenser 220 does not involve any wiping electrical contacts to provide the required variable capacity so that an extremely noise free and trouble free vernier tuning unit is provided. In addition it will be noted that with the vernier tuning arrangement of the present invention, the vernier tuning knob 39 is completely independent of the V. H. F. station selector shaft 33 while providing a unit wherein the shafts 33 and 38 may be of relatively great length without producing undesired interaction between the controls. Thus, the V. H. F. station selector knob 35 may be rapidly rotated without producing any variation in the position of the vernier tuning knob 39 since the shaft 38 engages the shaft 33 only at relatively small areas at each end thereof.

In order to provide good electrical contact between the partition 162 and the supporting screws 216 and 217 so that currents flowing in the compartment 163 will not be conducted into the compartment 164, and vice-versa, the spacer elements 240 and 241 (Fig. 2), which space the switch section 213 from the partition 162, are preferably made of metal and are provided with a conical end portion 242 as shown in Fig. 7. A small band 243 of soft metal, such as solder, is positioned within the conical end portion 242 during assembly so that as the adjustment nut 244 is tightened the solder 243 is wedged into the opening between the partition 162 and the screw 217 so as to provide a positive electrical connection between these members, as best illustrated in Fig. 8.

Considering now in more detail the U. H. F. tuner portion 31, the cup-shaped housing 70 is provided with a first partition 250 to define an R. F. tuning compartment 251, a second partition 252 to define a mixer compartment 253, and a third partition 254 to define an oscillator compartment 255, the partitions 250, 252 and 254 being electrically grounded to the main tuning shaft 232 by means of the spring clips 256, 257 and 258, respectively. Each of the U. H. F. antenna input terminals 185 and 186 is connected to a coupling loop 260 so as to couple signals received from the U. H. F. television stations to a tuned circuit comprising a center conductor 261 which is supported from the top wall 262 of the housing 70 and carries a stationary condenser plate 263 on the other end thereof, a pair of rotor plates 264 and 265 being rotatably mounted and electrically connected to the main tuning shaft 32 so as to provide a variable capacity for this U. H. F. resonant circuit. In the mixer compartment 253 a central bar type conductor 270 is secured to the top wall 262 and supports the stator plate 271 which cooperates with the plates 272 on the shaft 32 to provide a mixer or converter resonant circuit which may be tuned to the desired U. H. F. station by rotation of the shaft 32. Energy may be coupled from the resonant circuit within the compartment 251 to the resonant circuit in the compartment 253 by means of a conductive strap 275 which may be electrically connected to the desired points on the bar conductors 261 and 270 and extends through a suitable clearance opening in the partition 250. A pair of conductive strips 276 and 277 are secured to the partition 250 and are provided with end portions which may be adjusted relatively close to the ends of the bars 261 and 270 so as to provide adjustable trimming capacities so that proper alignment can be made over the U. H. F. band.

In the oscillator tuning compartment 255, a tube socket 280 is provided for the oscillator tube 281 which is preferably of the commercial type 6AF4. The tube socket 280 is provided with a centrally located tubular centerpost 282 which is soldered to one end of a bar conductor 283 so as to provide an electrical connection to and support for one end of the bar 283, this bar being supported in the center thereof by means of a partition 284 of high dielectric material which is secured to the partition 254 and the side wall 72. By supporting the bar 283 at both the center thereof and within the centerpost 282 a rigid support for the bar 283 is provided so that if the U. H. F. tuner portion 31 is subjected to vibration, microphonics and spurious oscillator signals are not produced. The bar 283 carries a plurality of stator plates 285, and a plurality of rotor plates 286 on the shaft 32 cooperate therewith to provide a variable resonant circuit of the correct frequency to heterodyne with the received U. H. F. signal and produce the desired intermediate frequency. A stud 287 is mounted in the side wall 72 so as to provide an adjustable capacity relative to the stator end of the bar 283 and an adjustable capacitor 288 is connected to the other end of the bar 283, the adjustment screws of the capacitors 287 and 288 being protected by the cylindrical shield members 289 and 290, respectively. In order to provide an extremely low inductance connection between the control grids of the oscillator tube 281 and the bar 283, the grid terminals 291 and 292 of the tube socket 280 are soldered directly to the center sleeve 282. With this arrangement an extremely low inductance connection to the bar 283 is provided so that the oscillator may be tuned to the highest frequency in the U. H. F. band. The bars 261, 270 and 283 are all preferably of a metal having low thermal expansion so that the tuning does not vary appreciably with temperature.

In order to provide the desired heterodyne or intermediate frequency signal from the received U. H. F. television signal, a crystal mixer 300 is provided to which the ultra high frequency signal and the signal developed in the oscillator tuning compartment 255 are coupled. More particularly, a cup-shaped metal member 301 is secured to the partition 252 and a feed-through type by-pass condenser 302 is positioned in an opening in the bottom of the cup-shaped member 301 with the center conductive band 303 of the condenser 302 soldered to the bottom of the member 301. The condenser 302 is provided with metal end caps 304 and 305, which are connected together through the ceramic body of the condenser 302 so as to provide a by-pass capacity between the center conductor and the grounded band 303. The end cap 304 is concave so as to receive the end pin 306 of the crystal mixer 300, the other end cap 305 of the condenser 302 being connected to one conductor 307 of a coupling condenser 308 which extends through a clearance opening in the partition 254, the other lead 309 of the condenser 308 being connected to the partition 254 inside the oscillator compartment 255 so as to provide a pick-up loop in the compartment 255 which picks up the desired amount of oscillator energy and feeds the same through the center conductor of the condenser 302 to the crystal 300.

In order to provide means for connecting the other terminal pin 310 of the crystal mixer 300 to the center conductor 270 in the mixer tuning compartment 253 while providing an arrangement whereby the amount of U. H. F. energy impressed upon the crystal 300 may be readily varied, a metallic sleeve 312 is slidably positioned on the bar 270 and is provided with a pair of spaced flexible arms 313 and 313*a*. The arm 313 is provided with an indentation 314 adapted to receive the end of the terminal 310 and hold the terminal 306 in engagement with the end cap 304. If the pin 310 of the crystal 300 is relatively long it may be wedged between the arms 313 and 313*a*. With this arrangement, a universal crystal pin connection is provided and the tapping point on the resonant circuit in the compartment 253 may be readily varied by sliding the sleeve 312 along the length of the bar 270. It will be noted that electrical contact is maintained to the crystal 300 during such movement of the sleeve 312 due to the provision of the flexible arm portions 313 and 313*a* and the fact that the crystal 300 can pivot about the concave end cap 304. Accordingly, the mixer portion of the U. H. F. tuner portion 31 may be readily aligned with regard to correct injection of the U. H. F. signal into the mixer 300 by simply sliding the sleeve 312 along the bar 270 until the desired coupling point is reached. It will also be noted that when the crystal is inserted into the indentation 314 or between the arms 313 and 313*a* the sleeve 312 is wrapped more tightly around the bar 270 so as to maintain the sleeve in its adjusted position.

The compartment 320 defined by the partitions 252 and 254 and the bracket 77, is employed as an intermediate frequency output compartment which communicates with the output plug 175 so that suitable energizing potentials may be supplied from the plug 175 to the terminals of the tube 281 while, at the same time, permitting an intermediate frequency output signal to be derived from the mixer compartment 253 and oscillator tuning compartment 255 on either side thereof. Thus, the end cap 305 of the feed-through condenser 302 is connected through a high frequency choke coil 321 to the terminal 322 of the plug 175, as is best illustrated in Fig. 13. It will be noted that harmonics which may be generated during the frequency conversion process in the crystal 300 are confined to the compartment 320 so that radiation of these undesired harmonic components of both the oscillator signal and the received U. H. F. signal is substantially prevented. It will also be noted that the partitions 252 and 254 together with the bracket 77 provide a substantially completely enclosed compartment for the gearing arrangement described in detail above whereby the tuning shaft 40 and the indicator sleeve 42 are interconnected with the transverse main tuning shaft 32 of the U. H. F. tuner portion 31. Furthermore, by driving the main tuning shaft 32 by means of the worm element 75 or the gear train 108, 105, 97, a simplified bearing arrangement may be provided for each end of the shaft 32 since this shaft is driven from gears located intermediate the supporting ends thereof. In arrangements wherein the tuning shaft extends through a bearing partition, an annular ball bearing race arrangement is usually required to support the shaft while permitting extension thereof through the partition. However, in the tuner of the present invention the shaft 32 is supported by a single ball bearing 318 at each end thereof, one of the end bearings being adjustable by means of the screw 319 to provide proper centering of the shaft 32.

Considering now the electrical features of the U. H. F. tuner portion 31 and referring to Fig. 16 wherein the same reference numerals have been given for corresponding circuit elements described above in connection with Figs. 10 to 14, inclusive, it will be understood that the coupling loops 260 will provide a balanced input circuit for the U. H. F. resonant circuit positioned within the tuning compartment 251 and rotation of the tuning shaft 32 produces a variation in the position of the rotor plates 264 so as to select a desired one of the U. H. F. television stations, the trimmer condenser 276 being provided for alignment over the U. H. F. band. A predetermined proportion of the energy developed in the above described resonant circuit is coupled to the mixer resonant circuit within the cavity 253 by means of the strap 275, the connection point of this strap to the bars 261 and 270 being chosen so as to provide the desired coupling therebetween. In the oscillator tuning compartment 255, the choke coils 330 and 331 are provided in the filament circuit of the oscillator tube 281 and a coil 332 is provided in the cathode circuit of this tube for neutralization purposes, as will be readily undertood by those skilled in the art. The tube 281 is of the triode type wherein the grid terminals are connected through the tube socket terminal members 291 and 292 (Fig. 12) to the center sleeve 282 of the tube socket 280 and to the bottom end of the conductive bar 283 in the tuning compartment 255 so as to provide extremely short low inductance connections to the oscillator resonant circuit. The anode terminals are connected together and are by-passed by means of a pair of condensers 333 which are positioned immediately adjacent the anode terminals of the socket 280, an energizing potential for the tube 281 being supplied from the terminal 334 of the plug 175 through the dropping resistor 335 when the V. H. F. station selector knob 35 is in the U. H. F. tuner position, as will be described in more detail hereinafter in connection with the V. H. F. schematic diagram shown in Fig. 15. Energy from the oscillator resonant circuit is picked up by the loop formed by the conductor 309 of the condenser 308 and is supplied through the condenser 308 to the cathode of the crystal mixer 300, the anode of the crystal 300 being slidably connected to the bar 270 by means of the above described conductive sleeve 312. The intermediate frequency signal which is produced in the crystal mixer circuit as a result of the heterodyning action thereof, is coupled through the radio frequency choke 321 to the output terminal 322 of the plug 175.

Considering now the electrical features of the V. H. F. tuner portion 30 and referring to Fig. 15 wherein elements corresponding to those described above in connection with Figs. 1 to 9, inclusive, have been given the same reference numerals, when the antenna switching unit 200 is in the position shown in Fig. 15, the contacts 203 of the switching unit 200 are connected to the contacts 202 so that signals received from television signals in the V. H. F. band are coupled to the V. H. F. input transformer, indicated generally at 340 (Fig. 15), which is positioned within the above-described antenna input compartment 161 and is substantially shielded from the other circuits of the V. H. F. tuner portion 30. The antenna input transformer 340 comprises a first pair of coils 341 and 342 which are wound on the rectangular coil from 343 (Fig. 4A) of high dielectric material, and a second pair of coils 344 and 345 which are wound on a second coil form 346, the coil forms 343 and 346 being supported in end plates 347 and 348 of high dielectric material which are secured to the sub-chassis 140 by means of the lugs 349. The antenna input terminals 187 and 188 are connected to one end of the windings 341 and 345, the corresponding ends of the windings 342 and 344 are connected to the ground lug 349, and the windings 341, 342 and 344, 345 of the transformer 340 are bi-filar wound so as to provide a balanced to unbalanced input circuit for the V. H. F. tuner portion 30, as will be readily understood by those skilled in the art. The coils 341 and 344 are connected to the output terminal 350 and to a trap circuit indicated generally at 351 which functions to remove 40 megacycle interference which may result from police signals or the like. More particularly, the circuit 351 includes a first shunt arm including a coil 352 and a variable condenser 353, a series arm including a coil 354 and a condenser 355, and a second shunt arm including a coil 356 and a variable condenser 357. The components 352 to 357, inclusive, are all positioned within the antenna input compartment 161 so as to provide effective shielding of these components from the other portions of the tuner. The output signal from the compartment 161 is coupled through a feed-through by-pass condenser 360 to a stator contact 361 on the switch section 211.

In the schematic diagram of Fig. 15 the switch rotors of each switch section are illustrated in developed form to simplify the illustration of the circuit connections thereto. For example, the first switch section 211 comprises a first rotor plate 362 to which electrical contact is made by means of the stator contact 361, another stator contact 363 being provided to connect a condenser 364 to the input circuit in certain other positions of the V. H. F. station selector shaft 33. The switch section 211 further comprises a second rotor plate positioned on the opposite side of the insulated switch rotor from the rotor plate 362 and electrically connected to the rotor plate 362, contact being continuously made to the rotor 365 by means of the stator contact 366 and connection being made to the stator contact 367 in the U. H. F. tuner position so as to ground the V. H. F. antenna input circuit in this position. The V. H. F. station selector switch 210 is shown in the channel 2 position in Fig. 15 so that rotation of the V. H. F. station selector knob 35 to the U. H. F. position shown in Fig. 3A causes the rotors of the switch sections 211 to 215, inclusive, to be moved upwardly as viewed in developed form in Fig. 15.

With regard to the general circuit arrangement of the V. H. F. tuner portion 30 shown in Fig. 15, it is pointed out that this arrangement is generally similar to the corresponding tuner arrangement shown and described in detail in the above identified Krepps Patent No. 2,665,377 and reference may be had thereto for a complete and detailed description thereof. However, for the purposes of the present invention it may be stated that the V. H. F. input signal which is coupled to the stator contact 366 is coupled through the condenser 370 to the stator contact 371 of the switch section 212 and through the stator contact 372 thereof and the coil 373 to the control grid 374 of the left hand section of the double triode input tube 145, which is preferably of the commercial type 6BZ7. The tube 145 is operated as a conventional cascode amplifier circuit wherein the anode 376 of the first triode section is connected through the coil 377 to the cathode of the second triode section so as to provide a low noise input circuit for the V. H. F. tuner portion 30, as will be readily understood by those skilled in the art. The control grid 380 of the second triode section of the tube 145 is operated at the correct biasing voltage by means of the voltage divider network 381, 382, which is supplied with operating potential from one B+ input terminal 383 of the V. H. F. tuner portion 30.

In the U. H. F. position of the switch 210, the stator contacts 385, 386 and 387 are connected together through the rotor plate 388 of the switch section 212 so that an additional capacitor 389 is connected across the input circuit to tune this circuit to the intermediate frequency signal derived from the U. H. F. tuner portion 31 which is connected through the terminal 390 of the receptacle 176, the condenser 391 and the incremental inductances 392 employed for V. H. F. reception to the cascode amplifier tube 145, it being understood that both the input and output circuits of this tube are tuned to the intermediate frequency signal produced by the U. H. F. tuner portion 31 when the station selector switch 210 is in the U. H. F. tuner position. A high impedance choke 395 is connected from the terminal 390 to ground to complete the D. C. return circuit for the crystal mixer 300 in the U. H. F. tuner portion 31. With this arrangement, the performance of the U. H. F. tuner portion 31 can be measured without unsoldering any connections, by removing the U. H. F. tuner portion 31 and connecting a suitable measuring circuit to the terminal 322 of the plug 175 in the U. H. F. tuner portion 31. The signal amplified in the tube 145 is coupled through the condensers 400, 401 and the coil 402 to the control grid 403 of the pentode section of the tube 146, the tube 146 being preferably of the commercial type 6U8 comprising a triode-pentode arrangement. The triode section of the tube 146 is employed as the V. H. F. oscillator and energizing potential is supplied to the plate of this triode section from the B+ input terminal 405 through the resistors 406, 407, the coil 408, the rotor plate 409 of the switch section 215 and the coil 410. The screen grid of the pentode section of the tube 146 is supplied with energizing potential through the resistors 411 and 412. The intermediate frequency signal derived from the anode of the pentode section of the tube 146, is coupled through the output transformer 429 to the output terminals 430 and 431 at the rear of the tuner unit.

In order to bias the pentode section of the tube 146 so that this tube may be operated as a converter for V. H. F. operation and as an I. F. amplifier for U. H. F. operation, the current drawn by the oscillator tube 281 in the U. H. F. tuner portion 31 is drawn through the resistor 411 for U. H. F. operation so as to reduce the screen grid voltage on the pentode section of the tube 146. More particularly, when the switch 210 is in the U. H. F. position, the B+ terminal 334 of the plug 175 is connected to the terminal 415 of the receptacle 176 and through the resistor 416 to the stator contact 417 on the switch section 215. In the U. H. F. tuner position the contact 417 is connected to the stator contact 418 so that energizing current for the U. H. F. oscillator tube 281 flows through the resistor 411, the contacts 418, 417 and the resistor 416 to the U. H. F. tuner portion 31. At the same time the triode section of the tube 146 is deenergized by the interruption of the anode circuit by the rotor plate 409. Since the oscillator current drawn by the tube 281 is substantially larger than the current drawn by the triode section of the tube 146 during V. H. F. operations, the screen grid potential for the pentode section of the tube 146 is substantially decreased during U. H. F. operation so as to bias this tube correctly for intermediate frequency amplification in the U. H. F. tuner position. A suitable AGC voltage may be impressed upon the terminal 420 and is coupled to the control grid of the left hand section of the tube 145 through the resistor 421, the incremental inductances 392 and the coil 373. The vernier tuning condenser 220, which is positioned on the back end of the switch assembly 210 and is varied by means of the vernier tuning knob 39, is connected from one end of the coil 410 to ground so as to provide a variable capacity across the incremental inductances 425 of the oscillator switch section 215. Filament power for the tubes 145 and 146 is continuously supplied from the terminal 428 and is also continuously supplied through the receptacle 176 and the plug 175 to the U. H. F. oscillator tube 281. With this arrangement substantially instantaneous switching from V. H. F. to U. H. F. reception is provided.

It will be noted from the foregoing description of the combined V. H. F.-U. H. F. tuner of the present invention that a direct signal path is provided through the tuner for both V. H. F. and U. H. F. reception so that regeneration, pickup of spurious signals and other undesired effects due to stray capacitances and inductances are completely avoided. Thus, during V. H. F. reception, the V. H. F. signals are connected to the input terminals 187, 188 and are coupled through the antenna input compartment 161, as indicated generally by the arrow 440 in Figs. 1 and 4, and through the feed-through condenser 360 into the tuning compartment 163. The signals are thereafter conducted through the compartments 163 and 164, as indicated by the arrow 441 in Fig. 1 to the output terminals at the rear of the tuner unit. For U. H. F. reception the U. H. F. signals are applied to the input terminals 185, 186 and are coupled through the compartments 251 and 253 to the output compartment 320, as indicated by the arrow 442 in Fig. 1, while, at the same time, oscillator energy from the tube 281 is coupled into the center compartment 320 as indicated by the arrow 443 in Fig. 1. The resulting intermediate frequency signal is coupled through the plug 175 and receptacle 176 into the tuning compartment 163 as indicated generally by the dotted line 444 and thereafter follows substantially the same path through the V. H. F. tuner portion 30 to the intermediate frequency output terminals 430 and 431 at the rear of the tuner unit. Accordingly, with the arrangement of the present invention wherein the U. H. F. tuner portion 31 is positioned transversely of the U. H. F. tuner portion 30 adjacent the front end thereof, a direct signal path for both V. H. F. and U. H. F. signal reception is provided wherein no doubling back of the received signals is required so that regeneration and spurious signal pickup is substantially avoided.

While there have been described what are at present considered to be the preferred embodiments of the invention, it will be understood that various modifications may be made therein which are within the true spirit and scope of the invention as defined in the appended claims.

What is claimed as new and desired to be secured by Letters Patent of the United States is:

1. A combined V. H. F.-U. H. F. television tuner, comprising V. H. F. tuner means for converting signals received from any one of a plurality of V. H. F. television stations into corresponding signals of an intermediate frequency, said V. H. F. tuner means including station selector switch means for selectively tuning said V. H. F. tuner means to signals from different ones of said V. H. F. television stations and vernier tuning means for adjusting the tuning of said V. H. F. tuner means in each of said V. H. F. station selecting positions and operable independently of said station selector switch means, a V. H. F. vernier tuning shaft connected to said vernier tuning means, a hollow V. H. F. station selector shaft concentric with said V. H. F. vernier tuning shaft and connected to said V. H. F. station selector means, U. H. F. tuner means for converting signals received from any one of a plurality of U. H. F. television stations into corresponding signals of an intermediate frequency and including a main tuning shaft rotation of which varies the tuning of said U. H. F. tuner means to select signals from different ones of said U. H. F. television stations, a hollow U. H. F. station selector shaft concentric with said V. H. F. station selector shaft, means including a worm and worm wheel assembly for driving said main tuning shaft from said U. H. F. station selector shaft at a reduced rate, a hollow U. H. F. indicator shaft concentric with said U. H. F. station selector shaft, gear means interconnecting said U. H. F. indicator shaft and said main tuning shaft, U. H. F. station indicator means on said U. H. F. indicator shaft for indicating the U. H. F. station position of said main tuning shaft, and cooperating means on said U. H. F. station selector shaft and said U. H. F. indicator shaft for driving said main tuning shaft in substantially direct ratio from said U. H. F. station selector shaft.

2. A combined V. H. F.-U. H. F. television tuner, comprising V. H. F. tuner means for converting signals received from any one of a plurality of V. H. F. television stations into corresponding signals of an intermediate frequency, said V. H. F. tuner means including station selector switch means for selectively tuning said V. H. F. tuner means to signals from different ones of said V. H. F. television stations and vernier tuning means for adjusting the tuning of said V. H. F. tuner means in each of said V. H. F. station selecting positions and operable independently of said station selector switch means, a V. H. F.

vernier tuning shaft connected to said vernier tuning means, a hollow V. H. F. station selector shaft concentric with said V. H. F. vernier tuning shaft and connected to said V. H. F. station selector means, U. H. F. tuner means for converting signals received from any one of a plurality of U. H. F. television stations into corresponding signals of an intermediate frequency and including a main tuning shaft rotation of which varies the tuning of said U. H. F. tuner means to select signals from different ones of said U. H. F. television stations, a hollow U. H. F. station selector shaft concentric with said V. H. F. station selector shaft, a hollow U. H. F. indicator shaft concentric with said U. H. F. station selector shaft, a worm positioned on said U. H. F. station selector shaft, a worm wheel on said main tuning shaft and in engagement with said worm, clutch means for driving said main tuning shaft from said U. H. F. station selector shaft through said worm and worm wheel, a hollow U. H. F. indicator shaft concentric with said U. H. F. station selector shaft, gear means connecting said U. H. F. indicator shaft and said main tuning shaft, U. H. F. station indicator means driven from said U. H. F. indicator shaft for indicating the U. H. F. station position of said main tuning shaft, and means for coupling said U. H. F. station selector shaft to said U. H. F. indicator shaft to drive said main tuning shaft through said gear means while said clutch means effectively disengages said worm wheel from said main tuning shaft.

3. A combined V. H. F.-U. H. F. television tuner, comprising a V. H. F. tuner section, a plurality of variable tuning elements mounted within said V. H. F. tuner section, a first tuning shaft journaled in said V. H. F. tuner section and operatively connected to said tuning elements, a U. H. F. tuner section, a plurality of separate compartments in said U. H. F. tuner section, a U. H. F. tuning shaft journaled in said U. H. F. tuner section and extending through said U. H. F. tuner compartments at one end of said U. H. F. tuner section, a plurality of variable tuning elements respectively mounted in a plurality of said U. H. F. tuner compartments near said one end and operatively connected to said U. H. F. tuning shaft whereby the values of said elements are varied by rotating said U. H. F. tuning shaft, an oscillator tube mounted at the other end of said U. H. F. tuner section and electrically connected to one of said tuning elements, said first tuning shaft and said U. H. F. tuning shaft being perpendicular to one another, said first tuning shaft extending into one of said U. H. F. tuner compartments intermediate said U. H. F. tuning shaft and said other end, said one U. H. F. tuner compartment being devoid of said variable tuning elements, a second tuning shaft concentric with at least a portion of said first tuning shaft, and means interconnecting said U. H. F. tuning shaft and said second tuning shaft whereby said U. H. F. tuning shaft may be rotated by rotation of said second tuning shaft.

4. A combined V. H. F.-U. H. F. television tuner, comprising a V. H. F. tuner section, a plurality of variable tuning elements mounted within said V. H. F. tuner section, a first tuning shaft journaled in said V. H. F. tuner section and operatively connected to said tuning elements, a U. H. F. tuner section, a plurality of separate compartments in said U. H. F. tuner section, a U. H. F. tuning shaft journaled in said U. H. F. tuner section and extending through said U. H. F. tuner compartments at one end of said U. H. F. tuner section, a plurality of variable tuning elements respectively mounted in a plurality of said U. H. F. tuner compartments near said one end and operatively connected to said U. H. F. tuning shaft whereby the values of said elements are varied by rotating said U. H. F. tuning shaft, an oscillator tube mounted at the other end of said U. H. F. tuner section and electrically connected to one of said tuning elements, said first tuning shaft and said U. H. F. tuning shaft being perpendicular to one another, the principal axis of said first tuning shaft extending into one of said U. H. F. tuner compartments intermediate said U. H. F. tuning shaft and said other end, said one U. H. F. tuner compartment being devoid of said variable tuning elements, a second tuning shaft concentric with at least a portion of said first tuning shaft, and means interconnecting said U. H. F. tuning shaft and said second tuning shaft whereby said U. H. F. tuning shaft may be rotated by rotation of said second tuning shaft.

5. A combined V. H. F.-U. H. F. television tuner as set forth in claim 3 wherein said first tuning shaft extends throughout and beyond said U. H. F. tuner section.

6. A combined V. H. F.-U. H. F. television tuner as set forth in claim 3 wherein said last-mentioned means is disposed within said one of said U. H. F. tuner compartments.

7. A combined V. H. F.-U. H. F. television tuner as set forth in claim 3 wherein said last-mentioned means includes a speed reduction unit.

8. A combined V. H. F.-U. H. F. television tuner as set forth in claim 3 wherein said last-mentioned means includes a speed reduction unit mounted in said one of said U. H. F. tuner compartments.

9. A combined V. H. F.-U. H. F. television tuner as set forth in claim 3 wherein a plug in connection is provided between said U. H. F. and V. H. F. tuner sections whereby they are removably secured together.

10. A combined V. H. F.-U. H. F. television tuner as set forth in claim 3 wherein said first and second tuning shafts are concentric, a U. H. F. tuning indicator shaft is concentrically mounted with respect to said first and second tuning shafts and means is provided for interconnecting said U. H. F. tuning shaft and said U. H. F. tuning indicator shaft for simultaneous rotation, said last-named means having a one-to-one ratio.

11. A combined V. H. F.-U. H. F. television tuner as set forth in claim 10 wherein said second tuning shaft and said U. H. F. tuning indicator shaft are outside of said first tuning shaft.

12. A combined V. H. F.-U. H. F. television tuner as set forth in claim 3 wherein said one U. H. F. tuner compartment is centrally disposed in said U. H. F. tuner section.

13. A combined V. H. F.-U. H. F. television tuner as set forth in claim 3 wherein said V. H. F. tuner section and said U. H. F. tuner section are contiguously mounted along the principal axis of said first tuning shaft and the adjacent sides of said tuner sections have substantially the same size and shape.

14. A combination U. H. F.-V. H. F. television tuner comprising a V. H. F. tuner section, a plurality of variable tuning elements mounted within said section, a V. H. F. tuning shaft journaled in said section and operatively connected to said tuning elements for selectively connecting them in an electric circuit, a U. H. F. tuner section, said U. H. F. tuner section having front and back walls and a plurality of partitions interconnecting said walls and dividing said U. H. F. tuner section into at least three compartments, one of said walls being juxtaposed with said V. H. F. tuner section, the principal axis of said V. H. F. tuning shaft extending through one of said walls externally of said three compartments, a U. H. F. tuning shaft journaled in said U. H. F. tuner section perpendicularly to said V. H. F. tuning shaft and extending through said three compartments, a plurality of rotor plates mounted on said U. H. F. tuning shaft and respectively disposed in said three compartments, a pluralty of sets of stationary capacitor plates mounted in said compartments in proximity to said rotor plates, said capacitor plates being portions of tuned circuits respectively disposed in said compartments, an oscillator tube mounted on said U. H. F. tuner section and electrically connected to one of said sets of rotor plates, a U. H. F. control shaft concentric with said V. H. F. tuning shaft and mounted externally thereof, and speed reduction means interconnecting said U. H. F. control shaft and U. H. F. tuning shaft, said speed reduction means being at least partially disposed adjacent the other of said walls of said U. H. F. tuner section externally of said three compartments.

References Cited in the file of this patent

UNITED STATES PATENTS

| | | |
|---|---|---|
| 1,896,168 | Gebhardt | Feb. 7, 1933 |
| 2,562,263 | Ehrlich | July 31, 1951 |
| 2,620,378 | Thias | Dec. 2, 1952 |
| 2,665,377 | Krepps | Jan. 5, 1954 |
| 2,691,724 | Hoffman | Oct. 12, 1954 |
| 2,769,961 | Chesney | Nov. 6, 1956 |
| 2,772,354 | Browder | Nov. 27, 1956 |
| 2,795,693 | Fisher | June 11, 1957 |
| 2,803,745 | Pan | Aug. 20, 1957 |